United States Patent
Lin et al.

(10) Patent No.: US 10,790,007 B1
(45) Date of Patent: Sep. 29, 2020

(54) MEMORY DEVICE AND METHOD FOR ASSITING READ OPERATION

(71) Applicant: Winbond Electronics Corp., Taichung (TW)

(72) Inventors: Chi-Shun Lin, San Jose, CA (US); Douk-Hyoun Ryu, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/691,604

(22) Filed: Nov. 22, 2019

(51) Int. Cl.
| | | |
|---|---|---|
| *G11C 11/4074* | (2006.01) | |
| *G11C 11/4091* | (2006.01) | |
| *H02M 3/07* | (2006.01) | |
| *G11C 11/408* | (2006.01) | |
| *G11C 11/406* | (2006.01) | |

(52) U.S. Cl.
CPC ...... *G11C 11/4074* (2013.01); *G11C 11/4082* (2013.01); *G11C 11/4091* (2013.01); *G11C 11/40626* (2013.01); *H02M 3/07* (2013.01)

(58) Field of Classification Search
CPC .......... G11C 11/4074; G11C 11/40626; G11C 11/4091; G11C 11/4082; H02M 3/07
USPC .................................................. 365/189.09
See application file for complete search history.

(56) References Cited

U.S. PATENT DOCUMENTS

| | | | | |
|---|---|---|---|---|
| 8,031,549 | B2 * | 10/2011 | Kenkare | H02J 1/102 365/226 |
| 8,120,975 | B2 * | 2/2012 | Kenkare | G11C 11/419 365/189.16 |
| 8,537,626 | B2 * | 9/2013 | Fujisawa | G11C 7/109 365/194 |
| 9,030,883 | B2 * | 5/2015 | He | G11C 16/06 365/185.19 |
| 2001/0012219 | A1 * | 8/2001 | Lee | G11C 16/30 365/189.09 |
| 2006/0010350 | A1 * | 1/2006 | Pelley | G11C 29/023 714/42 |

FOREIGN PATENT DOCUMENTS

| | | |
|---|---|---|
| CN | 101127244 | 2/2008 |
| TW | 521500 | 2/2003 |

* cited by examiner

*Primary Examiner* — Fernando Hidalgo
(74) *Attorney, Agent, or Firm* — JCIPRNET

(57) ABSTRACT

A memory device and a method of assisting a read operation in the memory device are introduced. The memory device may include a logic circuit, a charge pump, a switch and a sense amplifier. The logic circuit is configured to receive at least one input signal and perform a logic operation on the at least one input signal to output an enable signal. The charge pump is coupled to the logic circuit and is configured to generate a boost voltage according to the enable signal. The switch is coupled between the charge pump and a sensing power supply line, and is configured to control an electrical connection between the charge pump and the sensing power supply line according to the enable signal to supply the boost voltage to the sensing power supply line. The sense amplifier is configured to perform a read operation using the boost voltage from the sensing power supply line.

18 Claims, 3 Drawing Sheets

MEMORY DEVICE AND METHOD FOR ASSITING READ OPERATION

BACKGROUND OF THE DISCLOSURE

1. Field of the Disclosure

The disclosure relates to a memory device, and particularly relates to a memory device and a method thereof that may improve performance of a read operation.

2. Description of Related Art

Recently, memory devices are used for storing information in a wide range of electronic devices. For a purpose of low power consumption, memory devices that have low supply power have been introduced. For example, a low-power memory device may have a sub-1V power-on-reset (POR) trip point and requires low power for a read operation (e.g., fuse read, register read) during a power-up process of the low-power memory device. However, low power supply may cause degradation in speed and accuracy of the read operation.

Along with the popularity of memory devices recently, there has grown a need for a more creative method and design for improving performance of the memory device.

SUMMARY OF THE DISCLOSURE

This disclosure introduces a memory device and a method thereof that may generate and supply a boost voltage to a sensing power supply line in a read operation, thereby improving performance of the read operation.

In some embodiments, the memory device includes a logic circuit, a charge pump, a switch and a sense amplifier. The logic circuit is configured to receive at least one input signal and perform a logic operation on the at least one input signal to output an enable signal. The charge pump is coupled to the logic circuit and is configured to generate a boost voltage according to the enable signal. The switch is coupled between the charge pump and a sensing power supply line, and is configured to control an electrical connection between the charge pump and the sensing power supply line according to the enable signal to supply the boost voltage to the sensing power supply line. The sense amplifier is configured to perform a read operation using the boost voltage from the sensing power supply line.

In some embodiments, the memory device includes a logic circuit, a multi-stage charge pump, a first switch, a second switch and a sense amplifier. The logic circuit is configured to receive at least one input signal and perform a logic operation on the at least one input signal to output an enable signal. The multi-stage charge pump may comprise a first stage and a second stage, and is configured to generate a first boost voltage by the first stage and a second boost voltage by the second stage according to the enable signal. The first switch is coupled between a first stage of the multi-stage charge pump and a sensing power supply line and is configured to supply the first boost voltage to the sensing power supply line according to the enable signal. The second switch is coupled between a second stage of the multi-stage charge pump and the sensing power supply line, and configured to supply the second boost voltage to the sensing power supply line according to the enable signal. The sense amplifier is configured to perform a read operation using the first boost voltage and the second boost voltage from the sensing power supply line.

In some embodiments, the method includes steps performing a logic operation on at least one input signal to generate an enable signal; generating a boost voltage, by a charge pump, according to the enable signal; controlling an electrical connection between the charge pump and the sensing power supply line according to the enable signal to supply the boost voltage to the sensing supply power line; and performing a read operation using the boost voltage from the sensing power supply line.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

It is to be understood that other embodiment may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
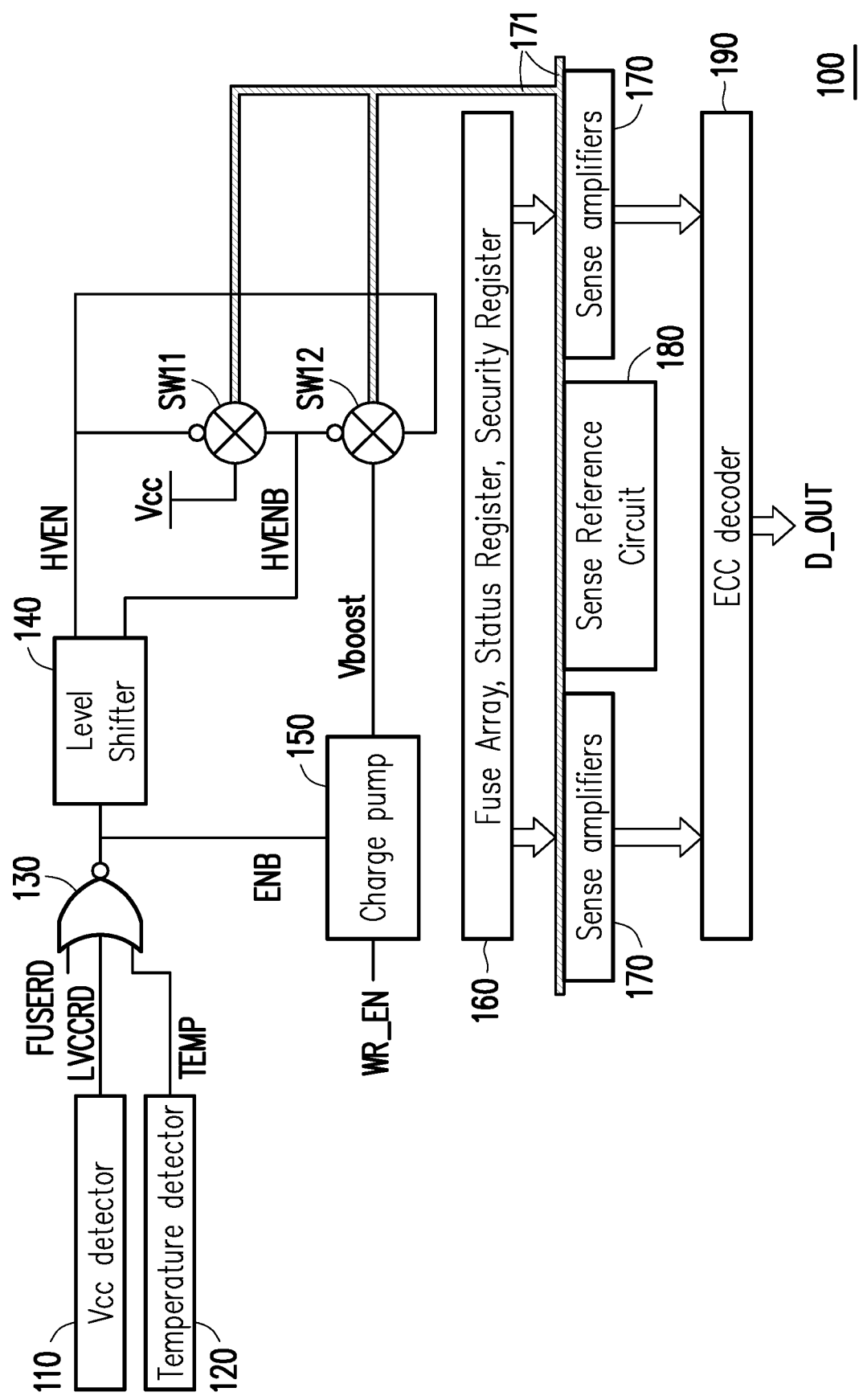
FIG. 1 is a schematic diagram illustrating a memory device in accordance with some embodiments of the disclosure.

Referring to FIG. 1, a memory device 100 may include a power supply detector 110 (or Vcc detector 110), a temperature detector 120, a logic circuit 130, a level shifter 140, switches SW1 and SW2, a charge pump 150, a circuitry 160, a sense amplifier 170, a sense reference circuit 180 and a decoder 190. The power supply detector 110 may detect a level of a supply voltage Vcc to generate a power detection signal LVCCRD. In some embodiments, the power detection signal LVCCRD may indicate whether the level of the supply voltage Vcc is less than a predetermined threshold voltage. For example, when the level of the supply voltage Vcc is less than the predetermined threshold voltage, the power detection signal LVCCRD may indicate a high logic level (e.g., logic level of "1"). When the level of the supply voltage Vcc is not less than the predetermined threshold voltage, the power detection signal LVCCRD may indicate a low voltage level (e.g., logic level of "0"). The level of the supply voltage Vcc may influence to the performance of the read operation. For example, when the supply voltage Vcc is low, the speed and accuracy of the read operation may be degraded. As such, a boost voltage is necessary for improving the performance of the read operation when the supply voltage Vcc is lower than the predetermined threshold voltage. In some embodiments, the predetermined threshold voltage may be a minimum voltage that is required for performing the read operation successfully. A type and a structure of the power supply detector 110 is not limited in the disclosure.

In some embodiments, the temperature detector 120 is configured to detect a temperature of the memory device 100 to generate a temperature signal TEMP. The temperature signal TEMP may indicate whether the temperature of the memory device is greater than a predetermined threshold temperature. For example, when the temperature of the memory device 100 is greater than the predetermined threshold temperature, the temperature signal TEMP may indicate the high logic level. When the temperature of the memory device 100 is not greater than the predetermined threshold temperature, the temperature signal TEMP may indicate the low logic level. Since the speed of a read operation on the memory device 100 may reduce when the temperature of the memory device 100 increases, a boost voltage for the read operation is necessary when the temperature of the memory device is high to improve the speed of the read operation. A type and a structure of the temperature detector 120 is not limited in the present disclosure.

In some embodiments, several read operations are performed during a power-up process of the memory device 100. For example, read operations are performed to read the information stored in a fuse array, a status register and a security register of the memory device 100 during the power-up process of the memory device 100. A power-up read signal FUSERD may be used to indicate whether at least one read operation is performed during the power-up process of the memory device 100. For example, when the read operation is performed during the power-up process, the power-up read signal FUSERD may have the high logic level; and the power-up read signal FUSERD may have the low logic level otherwise. In some embodiments, when at least one read operation is performed during the power-up process, a boost voltage may be generated and supplied for the at least one read operation.

In FIG. 1, the fuse array, the status register and the security register are represented by a circuitry 160, but the positions of the fuse array, the status register and the security register are not limited to what is shown in FIG. 1. In some embodiments, the fuse array of the memory device 100 may store information related to an identity of the memory device 100, redundancy addresses of the memory device 100, or any other information that is suitable to be stored in the fuse array. The status register of the memory device 100 may store information related to a status of memory cells/blocks in the memory device 100. The status of the memory cells/blocks may include a busy status, an idle status, or other suitable statuses. The security register of the memory device 100 may store security information, such as protected cells/blocks, non-protected cells/blocks of the memory device 100.

In some embodiments, memory device 100 may be configured to perform a low-power write operation that is followed by a low-power read verify operation. A verify signal (not shown) may be used to indicate whether the low-power read verify operation is performed. When the low-power read verify operation is performed to the memory device 100, a boost voltage may be generated and supplied for the low-power read verify operation, to improve the speed and accuracy of the low-power read verify operation.

The logic circuit 130 may receive at least one of the power detection signal LVCCRD, the temperature signal TEMP and the power-up read signal FUSERD, and perform a logic operation on the received signals to generate a signal ENB. In some embodiments, the logic circuit 130 may be or may include a NOR logic gate that is configured to perform a NOR operation to the power detection signal LVCCRD, the temperature signal TEMP and the power-up read signal FUSERD inputted to the logic circuit 130. As such, when all the power-up read signal FUSERD, the temperature detection signal TEMP and the power detection signal LVCCRD are at the low logic level (e.g., logic level of "0"), the signal ENB has the high logic level (e.g., logic level of "1"). When at least one of the power-up read signal FUSERD, the temperature detection signal TEMP and the power detection signal LVCCRD is at the high logic level (e.g., logic level of "1"), the signal ENB has the low logic level (e.g., logic level of "0"). The signal ENB may indicate an occurrence of at least one of the following events: a read operation during the power-up process through the power-up read signal FUSERD, too high temperature through the temperature detection signal TEMP and too low supply voltage Vcc through the power detection signal LVCCRD. It is noted that the structure of the logic circuit 130 is not limited to what is shown in FIG. 1, any logic circuit that has a function of performing a logic operation to generate the signal ENB based on at least one input signal fall within the scope of the disclosure.

In some embodiments, the charge pump 150 is coupled to the logic circuit 130 to receive the signal ENB from the logic circuit 130. The charge pump 150 is configured to generate a boost voltage Vboost which may be greater than the supply voltage Vcc in a power boost mode. The enablement of the power boost mode is determined based on the signal ENB (or a signal EN which is an inverted signal of ENB). In some embodiments, when the signal ENB is at the low logic level (when at least one of the power detection signal LVCCRD, the temperature signal TEMP and the power-up read signal FUSERD is at the high logic level), the power boost mode is enabled to generate the boost voltage Vboost. Alternatively, when the signal ENB is at the high logic level (e.g., when all the power detection signal LVCCRD, the temperature signal TEMP and the power-up read signal FUSERD is at the low logic level), the power boost mode is disabled.

In some embodiments, the charge pump 150 may further receive a write enable signal WR_EN which is an enable signal for a write operation. Upon a receipt of the write enable signal WR_EN, the charge pump 150 may generate the boost voltage Vboost for the write operation. In other words, the charge pump 150 may be shared for the write operations and read operations in the power boost mode.

In some embodiments, the level shifter 140 is coupled to the logic circuit 130 to receive the signal ENB, and is configured to convert the signal ENB to generate signals HVEN and HVENB. The signal HVEN is an inverted signal of the signal HVENB; and voltage levels of the signals HVEN and HVENB are different from the voltage level of the signal ENB. For example, the absolute value of the levels of the signals HVEN and HVENB may be greater than the voltage level of the signal ENB.

The switches SW11 and SW12 are coupled to the level shifter 140 to receive the signals HVEN and HVENB as control signals for the switches SW11 and SW12. In some embodiments, the signal HVENB is at the low logic level and the HVEN is at the high logic level when the power boost mode is enabled. As such, the switch SW11 is turned off and the switch SW2 is turned on to electrically connect the charge pump 150 to a sensing power supply line 171, so as to supply the boost voltage Vboost to the sensing power supply line 171 during the power boost mode. Alternatively, the signal HVENB is at the high logic level and the HVEN is at the low logic level when the power boost mode is disabled. Accordingly, switch SW12 is turned off and the switch SW11 is turned on to supply the power supply voltage Vcc to the sensing power supply line 171. In other words, the switches SW11 and SW12 may control an electrical connection between the charge pump 150 and the sensing power supply line 171 based on the signals HVEN and HVENB.

In some embodiments, the sense amplifier 170 is coupled to the sensing power supply line 171, and is configured to perform a read operation based on power received from the sensing power supply line 171. When the power boost mode is disabled (e.g., switch SW11 is turned on and the switch SW12 is turned off), the sense amplifier 170 may perform the read operation based on the supply voltage Vcc. When the power boost mode is enabled (e.g., switch SW11 is turned off and the switch SW12 is turned on), the sense amplifier 170 may perform the read operation based on the boost voltage Vboost. In some embodiments, the sense reference circuit 180 is configured to generate a reference voltage and output the reference voltage to the sense amplifier 170. The sense amplifier 170 may perform the read operation based on the reference voltage outputted from the sense reference circuit 180.

The decoder 190 is coupled to the sense amplifier 170, and is configured to decode data outputted by the sense amplifier 170 to generate output data D_OUT of the read operation. In some embodiments, decoder 190 may be an error correction code (ECC) decoder, but a type and structure of the decoder 190 are not limited in the present application.

Figure 2:
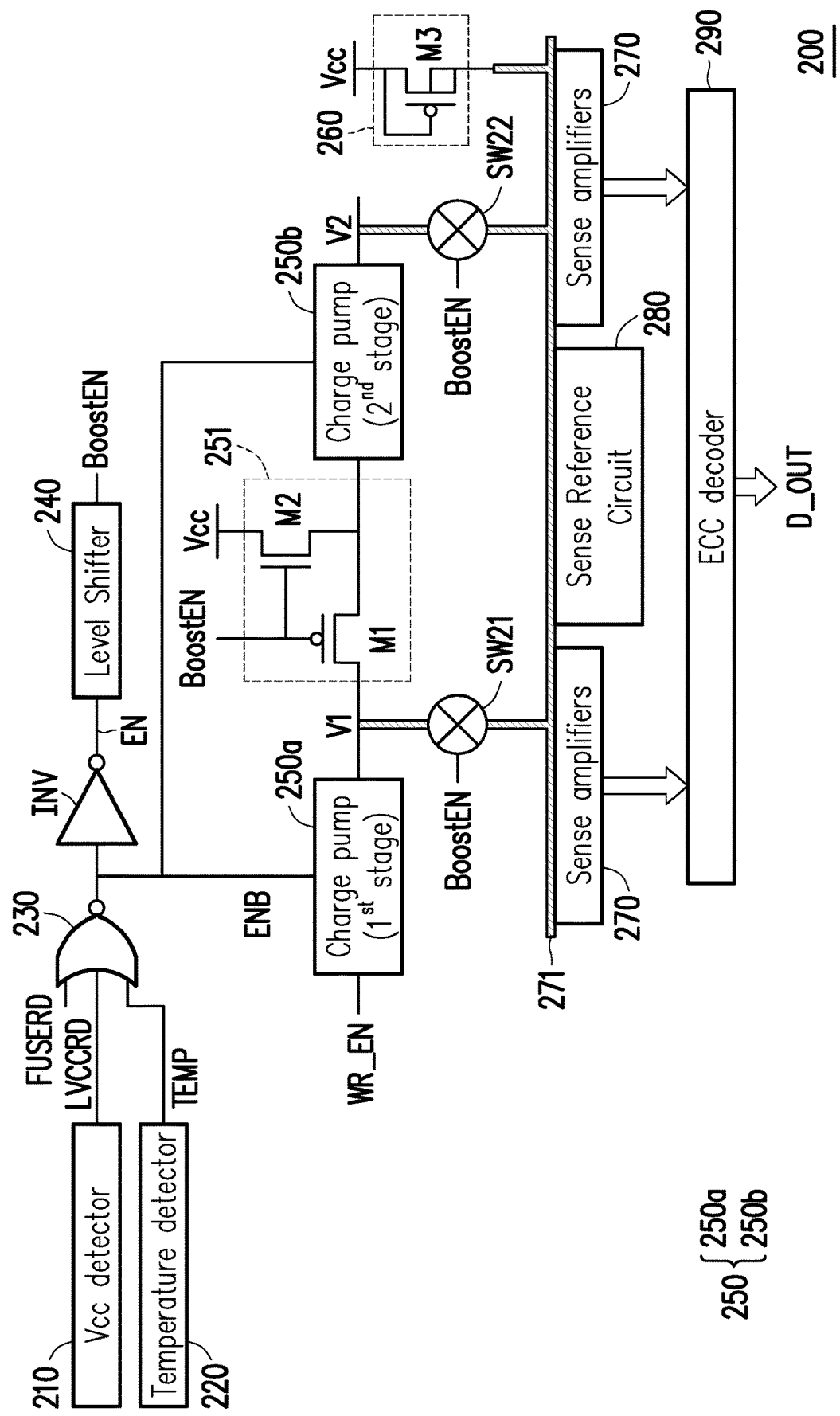
FIG. 2 is a schematic diagram illustrating memory device in accordance with some alternative embodiments of the disclosure.

Referring to FIG. 2, a memory device 200 may include a power supply detector 210, a temperature detector 220, a logic circuit 230, a level shifter 240, a multi-stage charge pump 250, switches SW21 and SW22, a clamp circuit 260, a sense amplifier 270, a sense reference circuit 280 and a decoder 290. In some embodiments, the power supply detector 210, the logic circuit 230, the sense amplifier 270, the sense reference circuit 280 and the decoder 290 as shown in FIG. 2 are similar to the power supply detector 110, the logic circuit 130, the sense amplifier 170, the sense reference circuit 180 and the decoder 190 as shown in FIG. 1, thus detailed description regarding these components are omitted hereafter.

The level shifter 240 may couple to the logic circuit 230 through an inverter INV. The inverter INV is configured to invert the signal ENB that is outputted by the logic circuit 230 to generate a signal EN. The level shifter 240 is configured to convert the signal EN to generate a signal BoostEN, wherein a voltage level of the signal BoostEN may be higher than a voltage level of the signal EN.

In some embodiments, the multi-stage charge pump 250 may include a first stage 250a and a second stage 250b that are coupled to the logic circuit 230 to receive the signal ENB. The first stage 250a and the second stage 250b of the multi-stage charge pump 250 may generate boost voltages V1 and V2, respectively in a power boost mode, in which the enablement of the power boost mode is determined based on the signal ENB. For example, when the signal ENB is at the low logic level, the power boost mode is enabled to generate the boost voltages V1 and V2, respectively. When the signal ENB is at the high logic level, the power boost mode is disabled.

In some embodiments, the multi-stage charge pump 250 may further receive a write enable signal WR_EN that is an enable signal of a write operation to the memory device 200. Upon the receipt of the write enable signal WR_EN, the multi-stage charge pump 250 is configured to generate the boost voltage V1 and V2 for the write operation. In some embodiments, the connecting circuit 251 is configured to electrically couple the first stage 250a and the second stage 250b in series during the write operation. As a result, the boost voltages V1 and V2 with different boost levels may be generated and supplied to the write operation.

In some embodiments, the connecting circuit 251 may include transistors M1 and M2, in which the transistor M1 is coupled between the first stage 250a and the second stage 250b and the transistor M2 is coupled between a reference node that receives the supply voltage Vcc and a connection node between the transistor M1 and the second stage 250b. The control terminals of the transistors M1 and M2 are configured to receive the signal BoostEN from the level shifter 240. As such, the connecting circuit 251 may control an electrical connection between the first stage 250a and the second stage 250b of the multi-stage charge pump 250. In some embodiments, the connecting circuit 251 is configured to electrically insulate the first stage 250a from the second stage 250b in the power boost mode for the read operation. In some alternative embodiments, the connecting circuit 251 may electrically couple the first stage 250a and the second stage 250b in series in a write operation to the memory device 200.

In some embodiments, the switches SW21 is coupled between the first stage 250a and the sensing power supply line 271 and is configured to control an electrical connection between the first stage 250a and the sensing power supply line 271 based on the signal BoostEN. The switch SW22 is coupled between the second stage 250b and the sensing power supply line 271 to control an electrical connection between the second stage 250b and the sensing power supply line 271 based on the signal BoostEN. In some embodiments, the signal BoostEN is configured to turn on switches SW21 and SW22 when the power boost mode is enabled. Particularly, when the power boost mode is enabled, the first stage 250a and the second stage 250b of the multi-stage charge pump 250 are enabled to generate the boost voltages V1 and V2 and the switches SW21 and SW22 are turned on to supply the boost voltages V1 and V2 to the sensing power supply line 271. Meanwhile, the connecting circuit 251 is configured to electrically insulate the first stage 250a from the second stage 250b. As such, the first stage 250a and the second stage 250b may act as two independent charge pumps operating in parallel to supply the boost voltages V1 and V2 to the sensing power supply line 271. In this way, an efficiency of boosting the voltages for the sensing power supply line 271 is improved.

In some embodiments, the clamp circuit 260 is coupled to the sensing power supply line, and is configured to clamp the voltage at the sensing power supply line 271 to a predetermined voltage level. In this way, the clamp circuit 260 may prevent a voltage overshoot during the power boost mode. The clamp circuit 260 may include a transistor M3 that is designed as a diode being coupled between a reference node that receives the supply voltage Vcc and the sensing power supply line 271. In some embodiments, the predetermined voltage level is determined according to the level of the supply voltage Vcc and a bias voltage of the transistor M3. It is noted that the structure of the clamp circuit 260 is not limited to what is illustrated in FIG. 2, any circuit that has a function of clamping the voltage of the sensing power supply line 271 falls within the scope of the disclosure.

Figure 3:
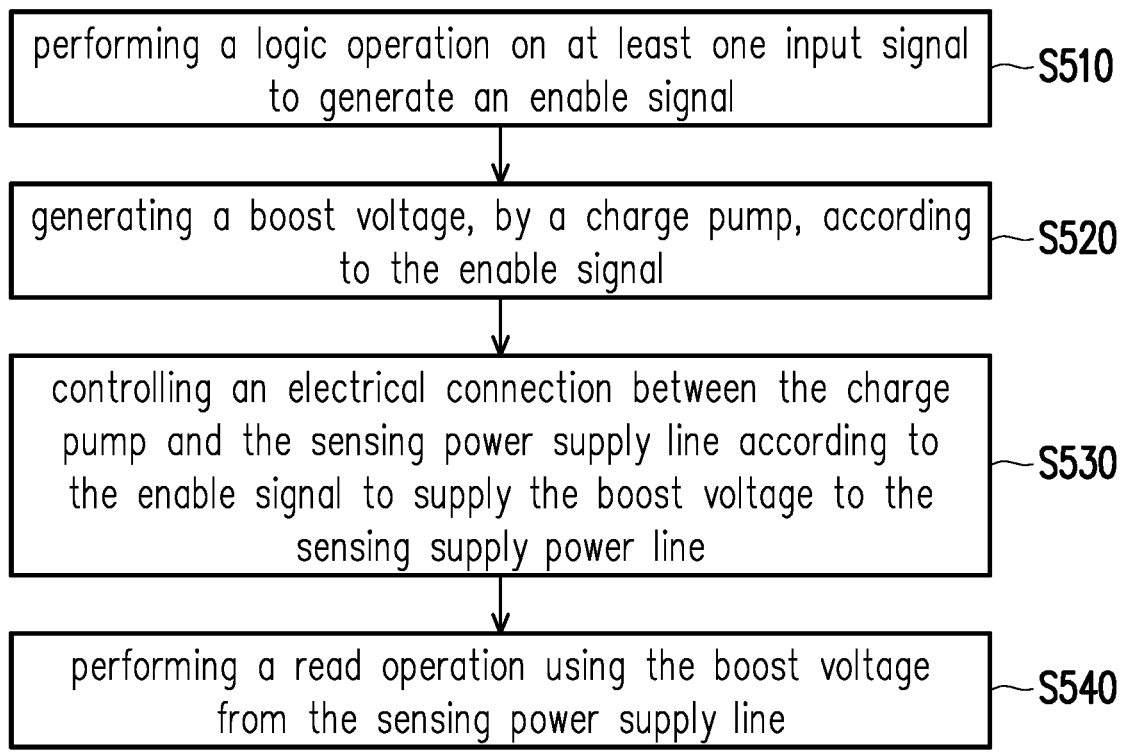
FIG. 3 is a flowchart diagram illustrating a method of assisting a read operation in a memory device in accordance with some embodiments of the disclosure.

Referring to FIG. 3, a flowchart diagram of a method of boosting power for a sensing power line in a read operation is illustrated. In step S510, a logic operation is performed on at least one input signal to generate an enable signal. In some embodiments, the at least one input signal may include at least one of a power-up read signal, a power detection signal and a temperature signal. The logic operation may be a NOR operation, but the disclosure is not limited thereto.

In step S520, a boost voltage is generated by a charge pump according to the enable signal. For example, when the enable signal is in a first logic level, the charge pump generates the boost voltage; and when the enable signal is in a second logic level, the charge pump does not generate the boost voltage.

In step S530, an electrical connection between the charge pump and the sensing power supply line is controlled according to the enable signal to supply the boost voltage to the sensing supply power line. In an example, when the enable signal is in the first logic level, the charge pump is electrically coupled to the sensing power supply line, such that the boost voltage is supplied to the sensing power supply line. When the enable signal is in the second logic level, the charge pump is electrically insulated from the sensing power supply line, such that the boost voltage is not supplied to the sensing power supply line.

In step S540, a read operation is performed using the boost voltage from the sensing power supply line. In some embodiments, the read operation may be or may include a read operation during a power-up process (such as a fuse read operation, a status register read operation, a security register read operation), a low-power read operation, and a verify read operation that is performed after performing a write operation.

In summary, the embodiments of the disclosure introduce a memory device and a method thereof that may boost the sensing power supply line in a power boost mode, thereby improving the performance of a read operation. A charge pump is used to generate a boost voltage based on an enable signal that is generated by performing a logic operation on at least one input signal. Electrical connections between the charge pump and the sensing power supply line are controlled by the enable signal through switches. As such, the boost voltage is supplied to the sensing power supply line during the read operation. In this way, the speed and accuracy of read operations (especially for low power read operations) in the memory device is improved. In addition, in some embodiments, the charge pump that is designed for a write operation of the memory device may be used to boost the voltage in the read operation. Thus, the manufacturing cost of the memory device of the present disclosure is reduced.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A memory device, comprising:
    a logic circuit, configured to receive at least one input signal and perform a logic operation on the at least one input signal to output an enable signal;
    a charge pump, coupled to the logic circuit, configured to generate a boost voltage according to the enable signal; and
    a switch, coupled between the charge pump and a sensing power supply line, configured to control an electrical connection between the charge pump and the sensing power supply line according to the enable signal to supply the boost voltage to the sensing power supply line; and
    a sense amplifier, configured to perform a read operation using the boost voltage from the sensing power supply line.

2. The memory device of claim 1, further comprising:
    a voltage detector, configured to detect a power supply voltage of the memory device to generate a voltage detection signal; and
    a temperature detector, configured to detect a temperature of the memory device to generate a temperature detection signal.

3. The memory device of claim 2, wherein
    the at least one input signal comprises at least one of the voltage detection signal, the temperature detection signal and a power-up read signal, and
    the power-up read signal comprises at least one of a fuse read signal, a status register read signal, and a security register read signal.

4. The memory device of claim 3, wherein the logic circuit comprises a NOR logic gate, and the logic operation on the at least one input signal is a NOR operation.

5. The memory device of claim 3, wherein the switch comprises:
    a first switch, coupled between a reference node that receives the power supply voltage and the sensing power supply line; and
    a second switch, coupled between the charge pump and the sensing power supply line.

6. The memory device of claim 5, wherein
    when the power-up read signal indicates that a power-up read operation is performed, the charge pump is enabled to supply the boost voltage to the sensing power supply line through the second switch, and
    when the voltage detection signal indicates that the power supply voltage is less than a predetermined threshold voltage, the charge pump is enabled to supply the boost voltage to the sensing power supply line through the second switch.

7. The memory device of claim 6, wherein when the temperature signal indicates that the temperature of the memory device is greater than a predetermined threshold temperature, the charge pump is enabled to supply the boost voltage to the sensing power line through the second switch.

8. The memory device of claim 5, further comprising:
    a level shifter, coupled to the logic circuit, the first switch and the second switch, configured to generate a first switch control signal and a second switch control signal based on the enable signal,
    wherein the first switch control signal is used to control the first switch and the second switch control signal is used to control the second switch.

9. A memory device, comprising:
    a logic circuit, configured to receive at least one input signal and perform a logic operation on the at least one input signal to output an enable signal;
    a multi-stage charge pump, comprises a first stage and a second stage, configured to generate a first boost voltage by the first stage and a second boost voltage by the second stage according to the enable signal; and
    a first switch, coupled between the first stage of the multi-stage charge pump and a sensing power supply line, configured to supply the first boost voltage to the sensing power supply line according to the enable signal;

a second switch, coupled between the second stage of the multi-stage charge pump and the sensing power supply line, configured to supply the second boost voltage to the sensing power supply line according to the enable signal; and a sense amplifier, configured to perform a read operation using the first boost voltage and the second boost voltage from the sensing power supply line.

10. The memory device of claim 9, further comprising:
a clamp circuit, coupled to the sensing power supply line, configured to clamp a voltage of the sensing power supply line to a pre-determined voltage level.

11. The memory device of claim 9, further comprising:
a level shifter, configured to generate a switch control signal based on the enable signal, wherein the first switch and the second switch are controlled by the switch control signal; and a connecting circuit, coupled between the first stage and the second stage of the multi-stage charge pump, configured to control an electrical connection between the first stage and the second stage of the multi-stage charge pump according to the boost enable signal.

12. The memory device of claim 11, wherein the connecting circuit comprising:
a first transistor, coupled between the first stage and the second stage of the multi-stage charge pump; and a second transistor, coupled between a reference node that receive a power supply voltage and a connection node between the first transistor and the second stage of the multi-stage charge pump, wherein a control terminal of the first transistor and a control terminal of the second transistor are coupled to receive the switch control signal.

13. The memory device of claim 9, wherein the at least one input signal comprises at least one of the voltage detection signal, the temperature detection signal and a power-up read signal.

14. The memory device of claim 13, wherein
when the power-up read signal indicates that a power-up read operation is performed, the multi-stage charge pump is enabled to supply the first boost voltage and the second boost voltage to the sensing power supply line through the first switch and the second switch, when the voltage detection signal indicates that the power supply voltage is less than a predetermined threshold voltage, the multi-stage charge pump is enabled to supply the first boost voltage and the second boost voltage to the sensing power supply line through the first switch and the second switch, and when the temperature signal indicates that the temperature of the memory device is greater than a predetermined threshold temperature, the multi-stage charge pump is enabled to supply the first boost voltage and the second boost voltage to the sensing power supply line through the first switch and the second switch.

15. A method of assisting a read operation in a memory device, comprising:
performing a logic operation on at least one input signal to generate an enable signal;

generating a boost voltage, by a charge pump, according to the enable signal;

controlling an electrical connection between the charge pump and the sensing power supply line according to the enable signal to supply the boost voltage to the sensing supply power line; and performing the read operation using the boost voltage from the sensing power supply line.

16. The method of claim 15, further comprising:
detecting a power supply voltage of the memory device to generate a voltage detection signal;

detecting a temperature of the memory device to generate a temperature detection signal; and detecting a power-up read signal which comprises at least one of a fuse read signal, a status register read signal, and a security register read signal, wherein the at least one input signal comprises at least one of the voltage detection signal, the temperature detection signal and a power-up read signal.

17. The method of claim 16, wherein performing the logic operation on the at least one input signal to generate the enable signal comprises:
performing a NOR logic operation on the at least one of the voltage detection signal, the temperature detection signal and a power-up read signal to generate the enable signal.

18. The method of claim 15, wherein controlling the electrical connection between the charge pump and the sensing power supply line according to the enable signal comprises:
supplying the boost voltage to the sensing power supply line when the power-up read signal indicates that a power-up read operation is performed;

supplying the boost voltage to the sensing power supply line when the voltage detection signal indicates that the power supply voltage is less than a predetermined threshold voltage, and supplying the boost voltage to the sensing power supply line when the temperature signal indicates that the temperature of the memory device is greater than a predetermined threshold temperature.

* * * * *